(12) United States Patent
Kanda et al.

(10) Patent No.: US 10,264,673 B2
(45) Date of Patent: Apr. 16, 2019

(54) BOARD AND ELECTRONIC DEVICE

(71) Applicant: FUJITSU LIMITED, Kawasaki-shi, Kanagawa (JP)

(72) Inventors: Takashi Kanda, Kawasaki (JP); Shunji Baba, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/613,427

(22) Filed: Jun. 5, 2017

(65) Prior Publication Data

US 2018/0027654 A1 Jan. 25, 2018

(30) Foreign Application Priority Data

Jul. 20, 2016 (JP) .................. 2016-142085

(51) Int. Cl.
*H05K 1/09* (2006.01)
*H05K 1/02* (2006.01)
*H05K 1/18* (2006.01)
*H05K 1/11* (2006.01)
(Continued)

(52) U.S. Cl.
CPC .......... *H05K 1/092* (2013.01); *H05K 1/0283* (2013.01); *H05K 1/111* (2013.01); *H05K 1/118* (2013.01); *H05K 1/181* (2013.01); *H05K 1/189* (2013.01); *H05K 3/246* (2013.01); *H05K 1/0277* (2013.01); *H05K 1/0393* (2013.01); *Y02P 70/611* (2015.11)

(58) Field of Classification Search
CPC ........ H05K 1/092; H05K 1/189; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/167; H05K 1/18; H05K 1/181; H05K 1/182; H05K 1/183; H05K 1/184; H05K 1/185
See application file for complete search history.

(56) References Cited

U.S. PATENT DOCUMENTS 8,314,339 B2* 11/2012 Kitajima ............. H05K 3/249
  174/255
2008/0257589 A1* 10/2008 Ostmann ............. H05K 1/0271
  174/254

(Continued)

FOREIGN PATENT DOCUMENTS

JP 59-169157 A 9/1984
JP 60-214596 A 10/1985
(Continued)

*Primary Examiner* — Ishwarbhai B Patel
(74) *Attorney, Agent, or Firm* — Fujitsu Patent Center

(57) ABSTRACT

A board includes a substrate having a bending property, a wiring pattern formed over the substrate and having a bending property, a conductive member formed over the wiring pattern, an electronic component; and a bonding member that bonds the conductive member and the electronic component to each other. And an electronic device includes a board having a bending property, a wiring pattern formed over the substrate and having a bending property, a conductive member formed over the wiring pattern, an electronic component; and a bonding member that bonds the conductive member and the electronic component to each other.

6 Claims, 19 Drawing Sheets

(51) Int. Cl.
*H05K 3/24* (2006.01)
*H05K 1/03* (2006.01)

(56) References Cited

U.S. PATENT DOCUMENTS

| | | | |
|---|---|---|---|
| 2010/0258341 A1* | 10/2010 | Sagawa | H05K 3/247 174/257 |
| 2012/0103678 A1* | 5/2012 | Inaba | H05K 3/244 174/263 |
| 2016/0270223 A1* | 9/2016 | Cherenack | H05K 1/0283 |
| 2018/0027661 A1* | 1/2018 | Ogura | H05K 1/0277 361/749 |

FOREIGN PATENT DOCUMENTS

| | | |
|---|---|---|
| JP | 10-117057 A | 5/1998 |
| JP | 2003-243788 A | 8/2003 |

\* cited by examiner

BOARD AND ELECTRONIC DEVICE

CROSS-REFERENCE TO RELATED APPLICATION

This application is based upon and claims the benefit of priority of the prior Japanese Patent Application No. 2016-142085, filed on Jul. 20, 2016, the entire contents of which are incorporated herein by reference.

FIELD

The embodiments discussed herein are related to a board and an electronic device.

BACKGROUND

As an electronic device having an electronic component mounted thereon, there has been known a wireless communication device that transmits beacon signals (wireless tags) or a wearable terminal that is usable while being worn on a body. When a rubber material is used in a substrate of the electronic device, an electronic device having bending resistance or stretching resistance may be implemented regardless of the installation position thereof.

In order to improve the stretching property of an electronic device or a board, a rubber material is used in a substrate of the electronic device or the board, and is also used in a wiring pattern on the substrate. As illustrated in FIG. 19, a bonding member 104 is formed on a wiring pattern 103 of a substrate 102 included in a board 101, and the wiring pattern 103 and a terminal 106 of an electronic component 105 are bonded to each other via the bonding member 104. The wiring pattern 103 is formed using a conductive paste of a rubber material. The bonding member 104 is formed using a solder paste or a conductive paste of a rubber material.

The conductive paste used for forming the wiring pattern 103 has poor solder wettability. Therefore, when the bonding member 104 is formed using a solder paste, a bonding failure may occur between the wiring pattern 103 and the terminal 106 of the electronic component 105.

There is affinity in adhesion between conductive pastes. When adhesiveness between the conductive paste used for forming the wiring pattern 103 and the conductive paste used for forming the bonding member 104 is low, a bonding failure may occur between the wiring pattern 103 and the terminal 106 of the electronic component 105. For example, a silicone-based conductive paste has high adhesiveness to a silicone-based conductive paste, but has low adhesiveness to other conductive pastes excluding the silicone-based conductive paste. Therefore, when a silicone-based conductive paste is used to form the wiring pattern 103, the bonding member 104 is formed using a silicone-based conductive paste. Since the wiring pattern 103 and the bonding member 104 are formed in consideration of adhesiveness between the conductive pastes, the choice of the type of the conductive paste is limited, which makes it difficult to improve cost reduction and mass-productivity.

A metal has a better solder wettability than the conductive paste. When a metal is used as a material of the wiring pattern 103, a solder may be used as a material of the bonding member 104. A metal has high adhesiveness to a conductive paste. When a metal is used as a material of the wiring pattern 103, the choice of the type of a conductive paste used for forming the bonding member 104 is expanded. However, a metal has higher rigidity than that of the conductive paste. Thus, when a metal is used as a material of the wiring pattern 103, the bending property (flexibility) of the board 101 may not be maintained, The followings are reference documents.
[Document 1] Japanese Laid-Open Patent Publication No. 10-117057,
[Document 2] Japanese Laid-Open Patent Publication No. 2003-243788,
[Document 3] Japanese Laid-Open Patent Publication No. 60-214596, and
[Document 4] Japanese Laid-Open Patent Publication No. 59-169157,

SUMMARY

According to an aspect of the embodiments, a board includes a substrate having a bending property, a wiring pattern formed over the substrate and having a bending property, a conductive member formed over the wiring pattern, an electronic component; and a bonding member that bonds the conductive member and the electronic component to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, exemplary embodiments will be described in detail with reference to the drawings. The configuration of each exemplary embodiment is merely given by way of example, and the present disclosure is not limited to the configuration of each exemplary embodiment.

<First Exemplary Embodiment>

Figure 1A:
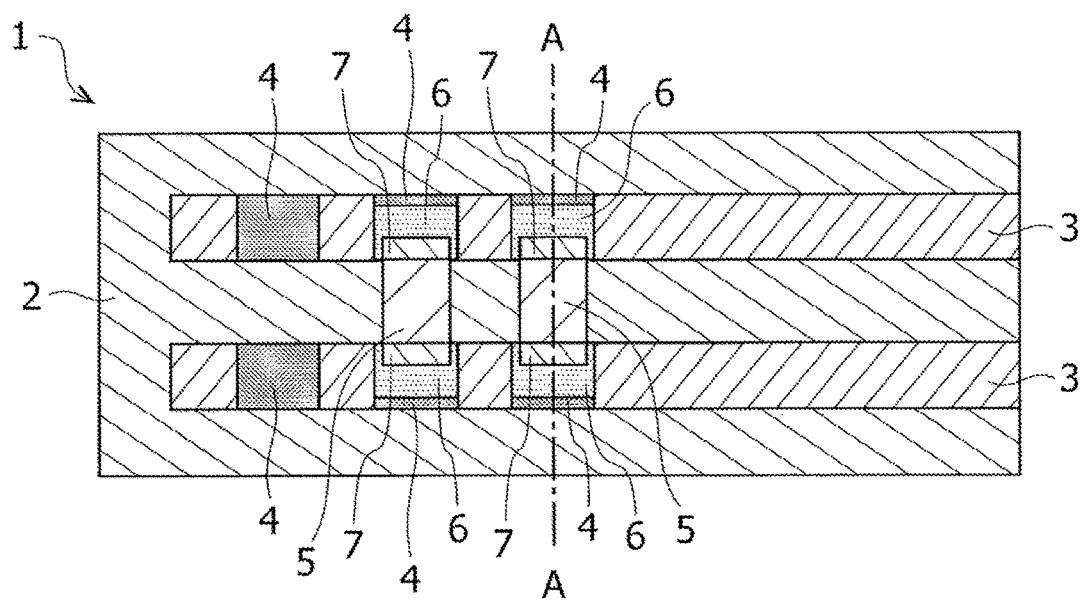
FIG. 1A is a plan view of a board.
Figure 1B:
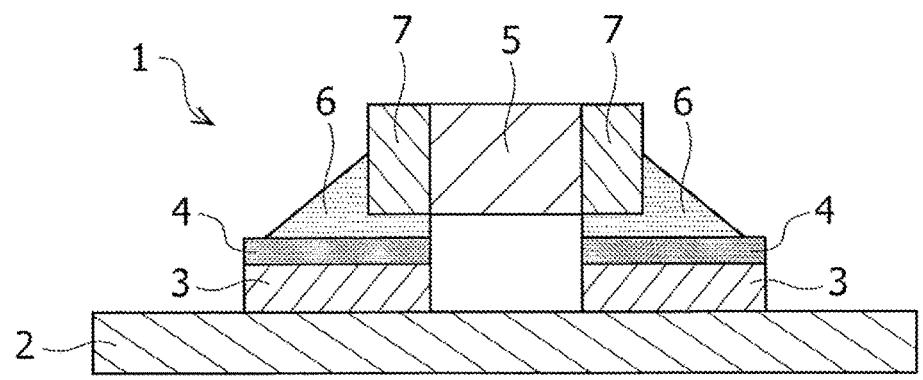
FIG. 1B is a cross-sectional view of the board.

A first exemplary embodiment will be described. FIG. 1A is a plan view of a board 1. FIG. 1B is a cross-sectional view of the board 1 and illustrates the cross section taken along one-dot dashed line A-A in FIG. 1A. The board 1 includes a substrate 2, a wiring pattern 3, a metal foil 4, an electronic component 5, and a bonding member 6. The metal foil 4 is an exemplary conductive member.

The substrate 2 has a bending property (flexibility) and a stretching property. A material of the substrate 2 is, for example, an elastomer. Examples of the elastomer may include silicone rubber, fluororubber, urethane rubber, acrylic rubber, butyl rubber, butadiene rubber, chloroprene rubber, and natural rubber.

The wiring pattern 3 is formed on the substrate 2. In the example illustrated in FIGS. 1A and 1B, two wiring patterns 3 are disposed in parallel on the substrate 2. The metal foil 4 is formed on the wiring pattern 3. One metal foil 4 may be formed on each wiring pattern 3, or multiple metal foils 4 may be formed on each wiring pattern 3. When multiple metal foils 4 are formed on each wiring pattern 3, the metal foils 4 are spaced apart from each other. Examples of the metal foil 4 include a silver (Ag) foil, a copper (Cu) foil, a gold (Au) foil, an aluminum (Al) foil, a nickel (Ni) foil, and a tin (Sn) foil. Although the metal foil 4 has a rectangular shape in a plan view in the example illustrated in FIGS. 1A and 1B, the present disclosure is not limited to the example illustrated in FIGS. 1A and 1B, and the metal foil 4 may have a circular or elliptical shape in a plan view.

The electronic component 5 includes an active component such as a semiconductor element, and a passive component such as a chip condenser. In the example illustrated in FIGS. 1A and 1B, the electronic component 5 is mounted on the substrate 2 such that both end portions of the electronic component 5 are positioned on the two wiring patterns 3, respectively. Terminals 7 are formed on both end portions of the electronic component 5. A bonding member 6 is formed between the metal foil 4 and the electronic component 5 to bond the metal foil 4 and the terminal 7 of the electronic component 5. The wiring pattern 3 and the electronic component 5 are electrically connected to each other via the metal foil 4 and the connection member 6.

<Method of Manufacturing Board 1>

Figure 2A:
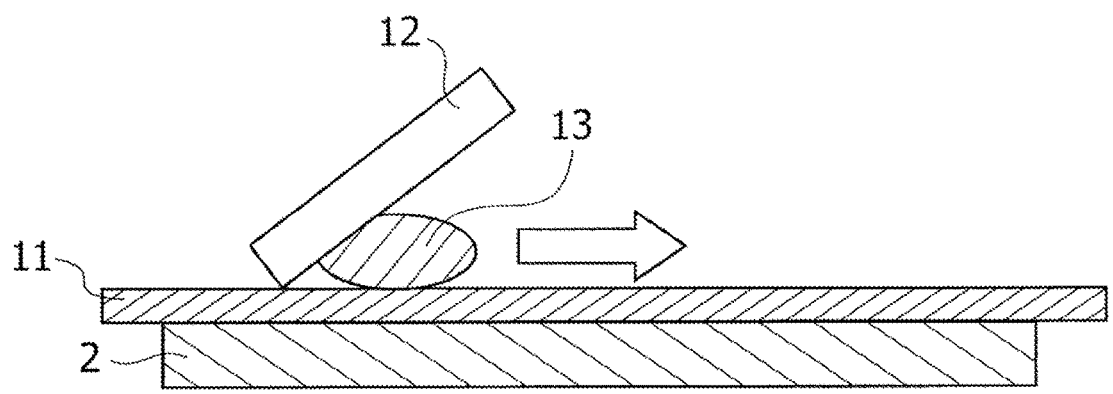
FIG. 2A is a side view of a substrate.
Figure 2B:
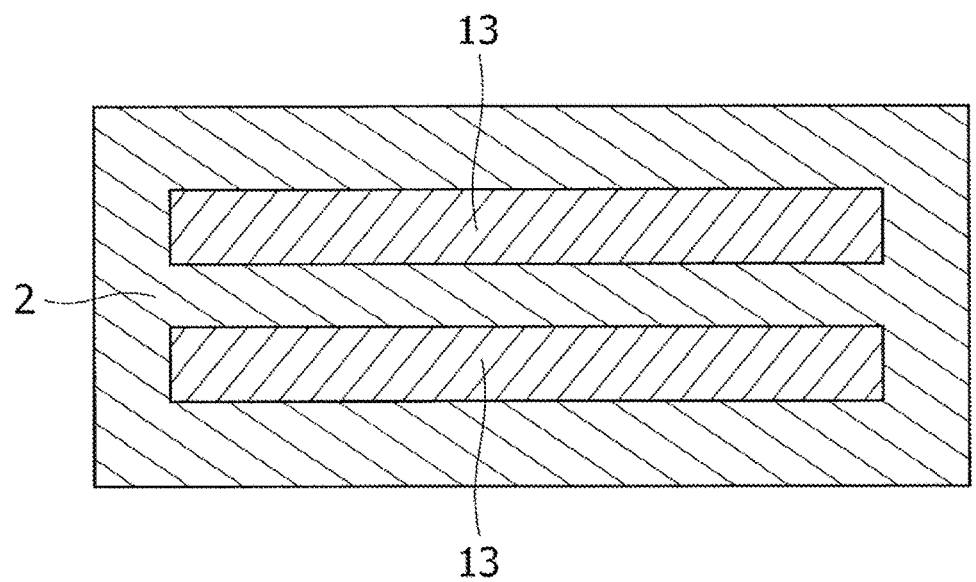
FIG. 2B is a plan view of the substrate.

An exemplary method of manufacturing the board 1 according to the first exemplary embodiment will be described with reference to FIGS. 2A to 7B. As illustrated in FIG. 2A, after the substrate 2 is disposed, a printing mask 11 is disposed on the substrate 2, and a conductive paste 13 is embedded in an opening of the printing mask 11 using a squeegee 12, so as to form multiple conductive pastes 13 on the substrate 2. The conductive paste 13 includes a binder resin and conductive particles. The binder resin is an exemplary resin. Subsequently, as illustrated in FIG. 2B, the printing mask 11 on the substrate 2 is removed. FIG. 2A is a side view of the substrate 2, and FIG. 2B is a plan view of the substrate 2.

Figure 3A:
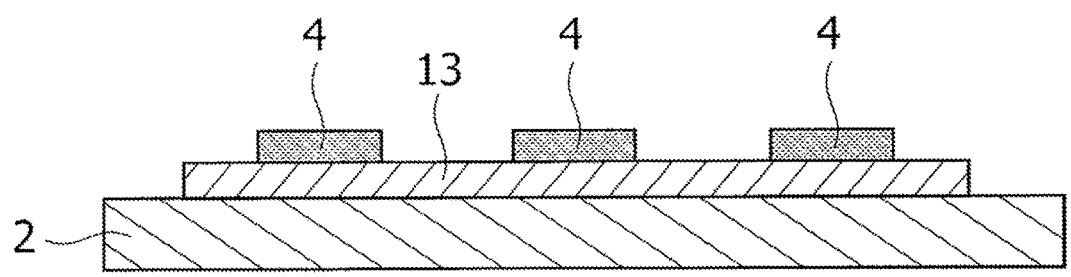
FIG. 3A is a cross-sectional view of the substrate.
Figure 3B:
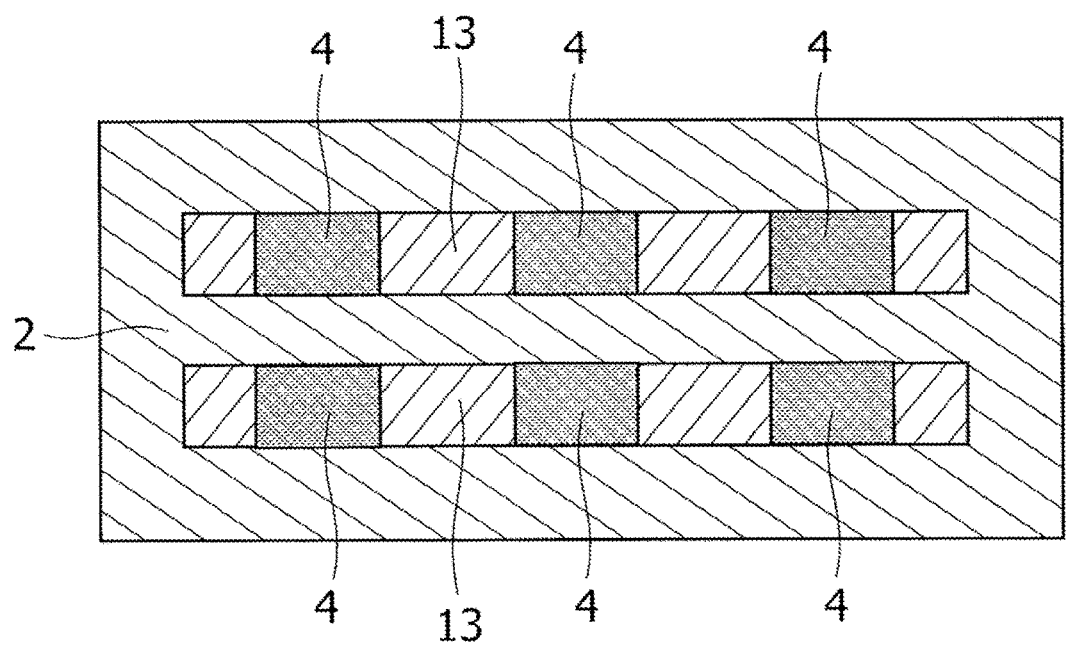
FIG. 3B is a plan view of the substrate.
Figure 4A:
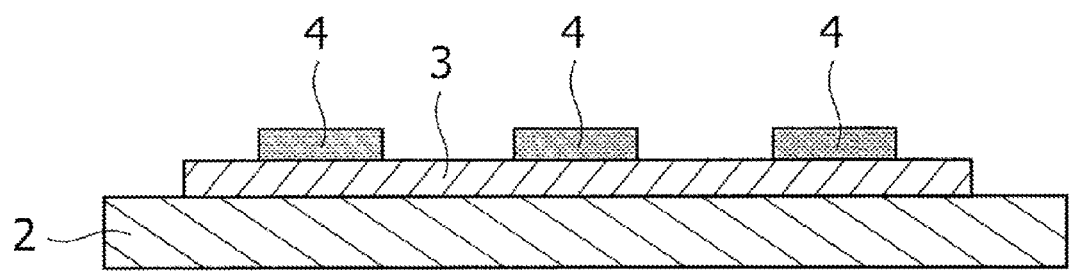
FIG. 4A is a cross-sectional view of the substrate.
Figure 4B:
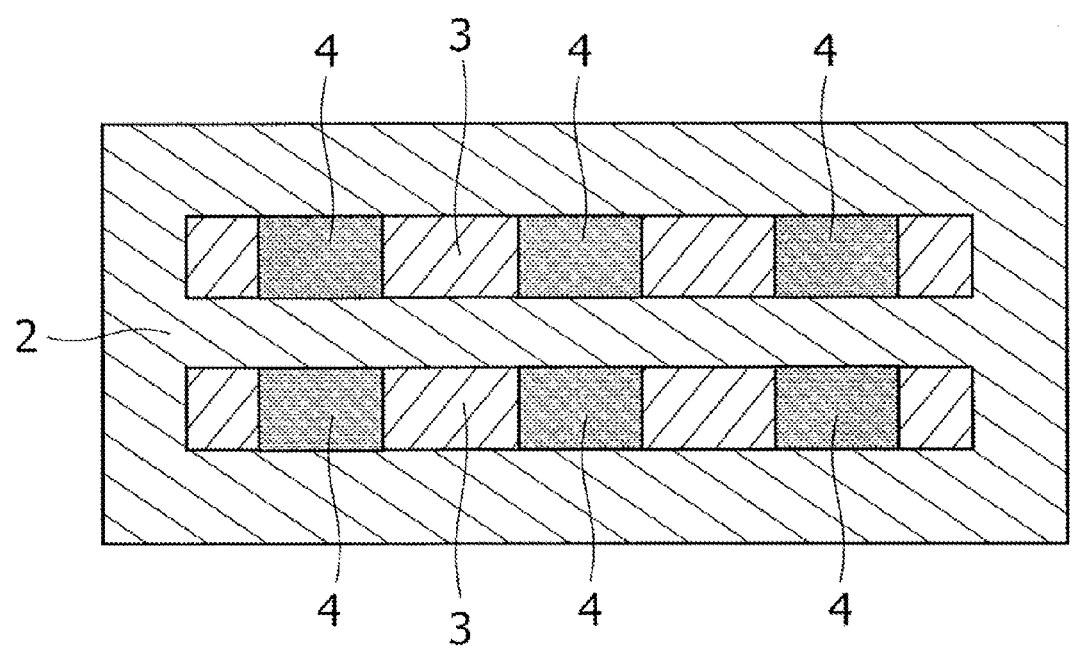
FIG. 4B is a plan view of the substrate.

Subsequently, as illustrated in FIGS. 3A and 3B, multiple metal foils 4 are stacked on each conductive paste 13. FIG. 3A is a cross-sectional view of the substrate 2, and FIG. 3B is a plan view of the substrate 2. Subsequently, the multiple conductive pastes 13 are cured by performing a heating processing. As illustrated in FIGS. 4A and 4B, multiple wiring patterns 3 are formed on the substrate 2 by curing the multiple conductive pastes 13. FIG. 4A is a cross-sectional view of the substrate 2, and FIG. 4B is a plan view of the substrate 2. When the conductive paste 13 is cured in a state where the conductive paste 13 and the metal foil 4 are in contact with each other, the wiring pattern 3 and the metal foil 4 are adhered to each other. Since the metal foil 4 has high adhesiveness to the conductive paste 13 regardless of the type of the conductive paste 13, the metal foil 4 has high adhesiveness to the wiring pattern 3.

Figure 5A:
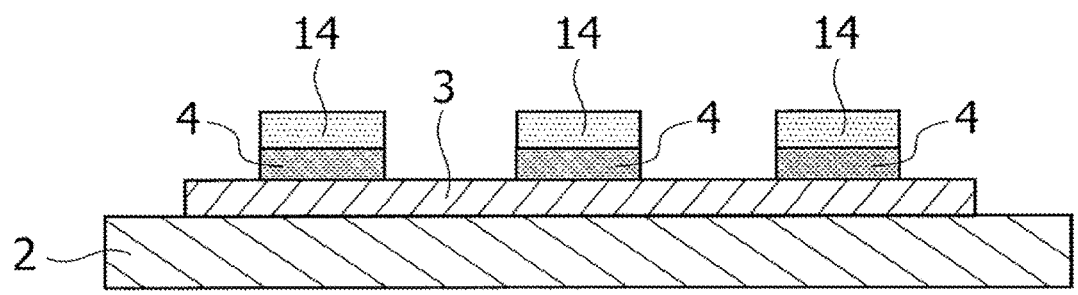
FIG. 5A is a cross-sectional view of the substrate.
Figure 5B:
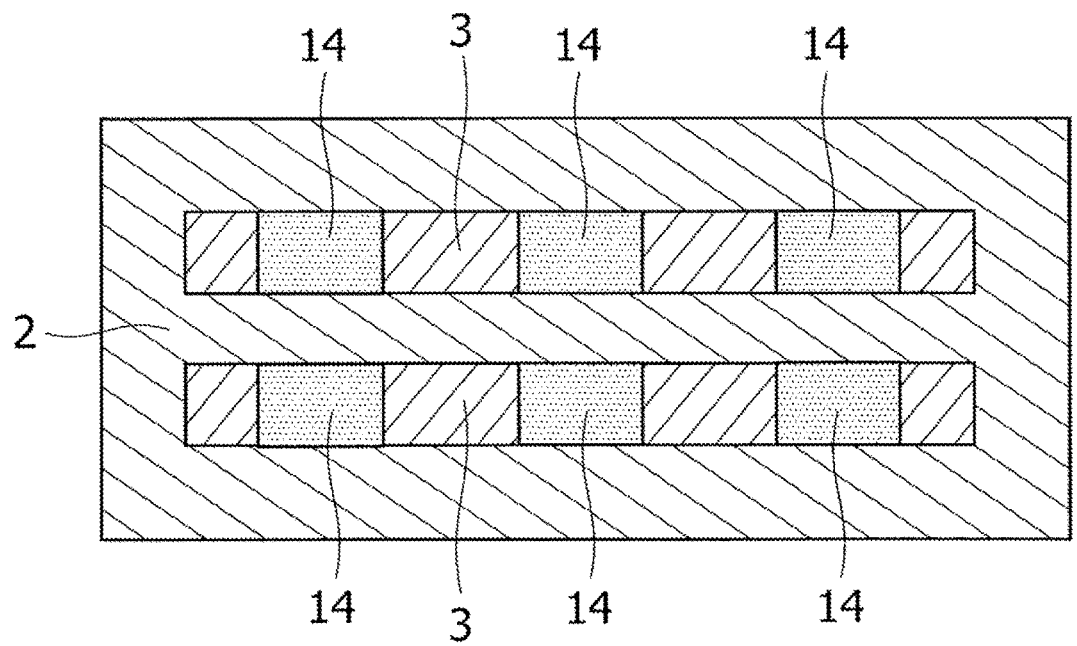
FIG. 5B is a plan view of the substrate.

Subsequently, as illustrated in FIGS. 5A and 5B, a paste 14 is formed on each metal foil 4. FIG. 5A is a cross-sectional view of the substrate 2, and FIG. 5B is a plan view of the substrate 2. For example, the paste 14 may be formed on each metal foil 4 via dispensing application or printing application. The paste 14 is a conductive paste or a solder paste. The conductive paste includes a binder resin and conductive particles. The solder paste includes solder powder and flux. For example, tin or an alloy including tin may be used as the solder.

Figure 6A:
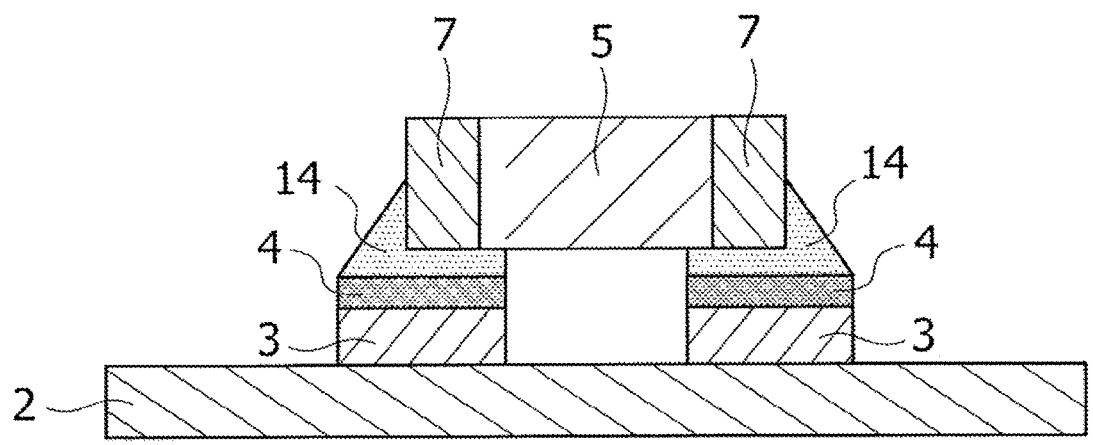
FIG. 6A is a cross-sectional view of the substrate.
Figure 6B:
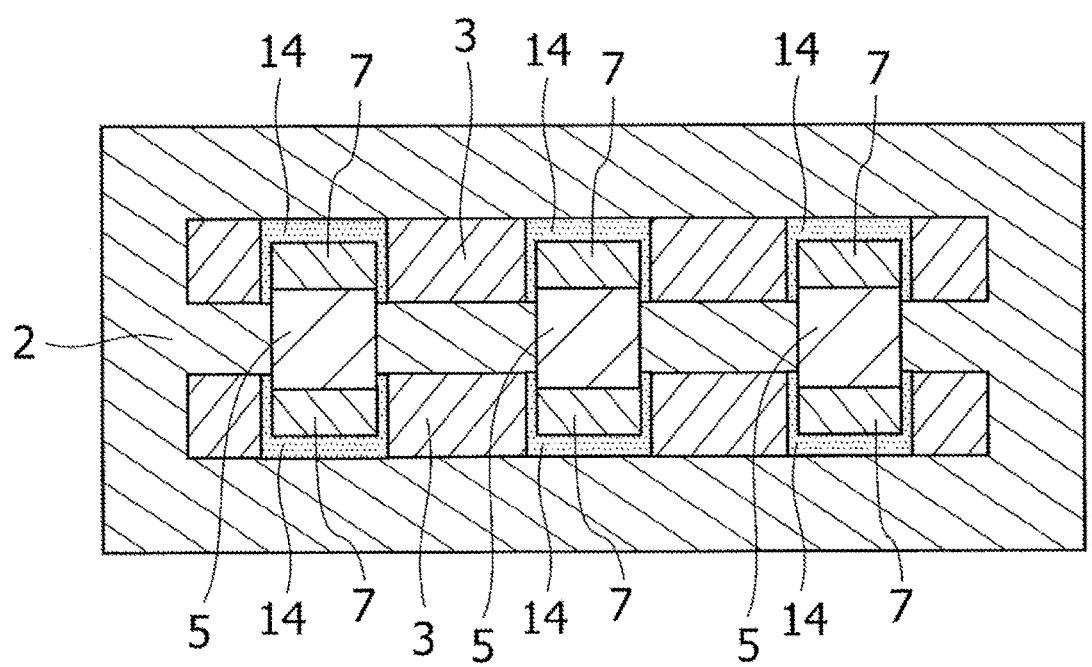
FIG. 6B is a plan view of the substrate.
Figure 7A:
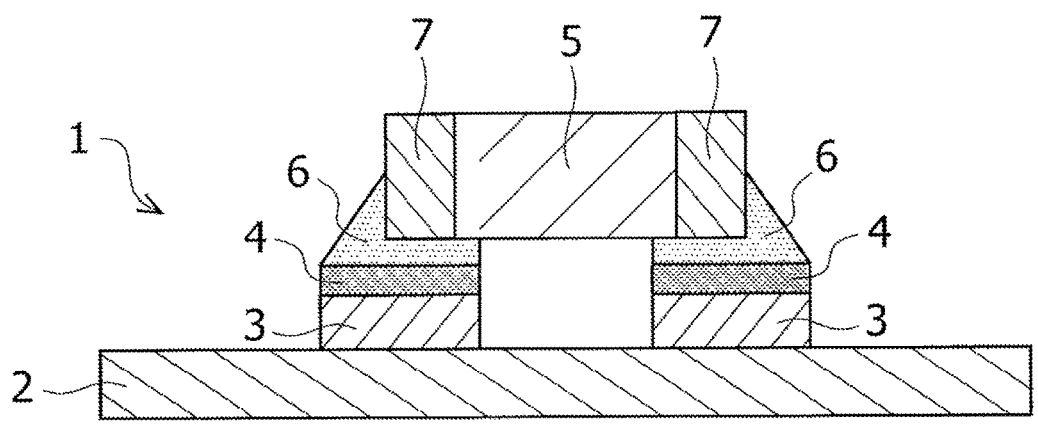
FIG. 7A is a cross-sectional view of the substrate.
Figure 7B:
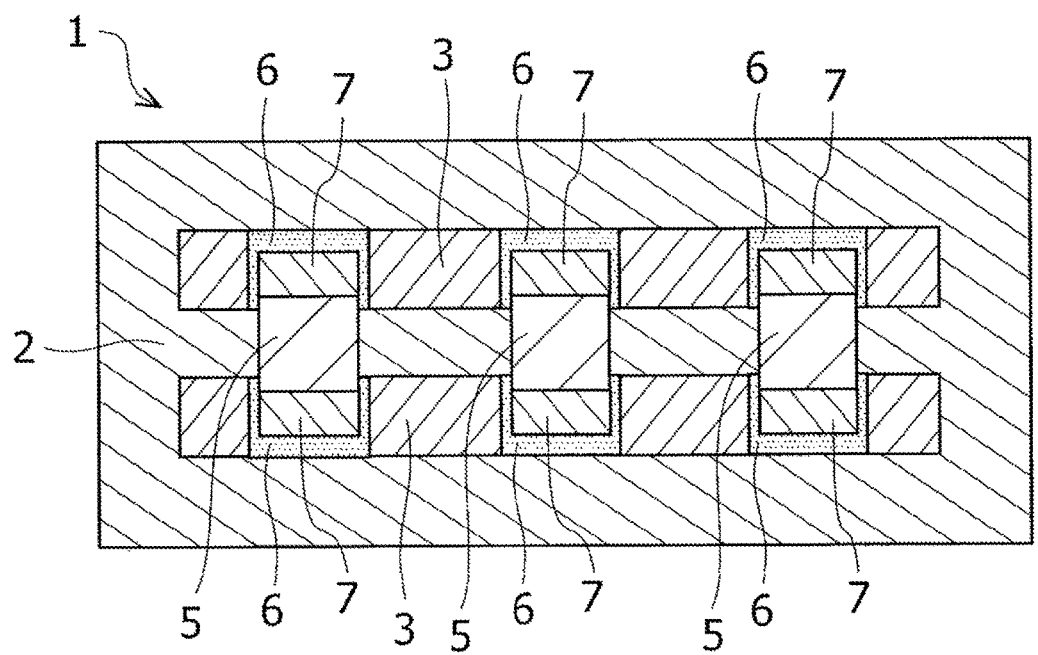
FIG. 7B is a plan view of the substrate.

Subsequently, as illustrated in FIGS. 6A and 6B, multiple electronic components 5 are mounted on the substrate 2. FIG. 6A is a cross-sectional view of the substrate 2, and FIG. 6B is a plan view of the substrate 2. For example, the multiple electronic components 5 are disposed so that the terminals 7 of each electronic component 5 are positioned on the paste 14. Subsequently, the paste 14 is cured by performing a heating processing. When the paste 14 is cured, as illustrated in FIGS. 7A and 7B, the bonding member 6 is formed between the metal foil 4 and the electronic component 5 to bond the metal foil 4 and the terminal 7 of the electronic component 5. FIG. 7A is a cross-sectional view of the substrate 2, and FIG. 7B is a plan view of the substrate 2. The board 1 is manufactured by performing the processes illustrated in FIGS. 2A to 7B.

The wiring pattern 3 is formed by curing the conductive paste 13 that includes a binder resin and conductive particles. Thus, the wiring pattern 3 includes a binder resin and conductive particles. In a case where the bonding member 6 is formed by curing the conductive paste that includes a binder resin and conductive particles, the bonding member 6 includes a binder resin and conductive particles. Examples of the binder resin include a silicone-based resin, an epoxy-based resin, a urethane-based resin, a polyester-based resin, an acryl-based resin, and a modified silicone-based resin. Examples of the conductive particles include metal particles such as copper particles, silver particles, gold particles, aluminum particles, nickel particles, tin particles, and palladium (Pd) particles, or a combination of two or more kinds of these metal particles. In a case where the bonding member 6 is formed by curing a solder paste, the bonding member 6 includes a solder, Regardless of the type of the binder resin included in the wiring pattern 3, the metal foil 4 has high adhesiveness to the wiring pattern 3. When the bonding member 6 includes a binder resin and conductive particles, the metal foil 4 has high adhesiveness to the bonding member 6 regardless of the type of the binder resin included in the bonding member 6. The metal foil 4 has good solder wettability. When the bonding member 6 includes a solder, the metal foil 4 has high adhesiveness to the bonding member 6. Therefore, when the metal foil 4 is interposed between the wiring pattern 3 and the bonding member 6, the wiring pattern 3 and the bonding member 6 are adhered to each other, and the bonding between the wiring pattern 3 and the terminal 7 of the electronic component 5 is secured.

In a case where the bonding member 6 includes a binder resin and conductive particles, the type of the binder resin included in the wiring pattern 3 and the type of the binder resin included in the bonding member 6 may be made different from each other by disposing the metal foil 4 between the wiring pattern 3 and the bonding member 6. In addition, the type of the binder resin included in the wiring pattern 3 may be the same as the type of the binder resin included in the bonding member 6.

The binder resin included in the wiring pattern 3 and the binder resin included in the bonding member 6 may be individually selected from among multiple types of binder resins. Therefore, the types of the binder resin included in the conductive paste 13 and the binder resin included in the conductive paste (paste 14) may be individually selected from among multiple types of binder resins. In this way, the electronic component 5 may be mounted on the substrate 2 regardless of the types of the binder resins. The conductive paste to be used as a material of the wiring pattern 3 may be selected from among multiple types of conductive paste. The conductive paste to be used as a material of the bonding member 6 may be selected from among multiple types of conductive paste.

For example, the binder resin included in the wiring pattern 3 may be a silicone-based resin, and the binder resin included in the bonding member 6 may be an epoxy-based resin. Since the silicone-based resin and the epoxy-based resin are different types of resins, the adhesiveness between the silicone-based resin and the epoxy-based resin is low. Since the board 1 includes the metal foil 4 between the wiring pattern 3 and the bonding member 6, even if the type of the binder resin included in the wiring pattern 3 differs from the type of the binder resin included in the bonding member 6, the wiring pattern 3 and the bonding member 6 are adhered to each other via the metal foil 4.

For example, the binder resin included in the wiring pattern 3 may be a silicone-based resin, and the bonding member 6 may include a solder. A binder resin and a solder have low adhesiveness therebetween. Since the board 1 includes the metal foil 4 between the wiring pattern 3 and the bonding member 6, the wiring pattern 3 and the bonding member 6 are adhered to each other via the metal foil 4 even when the bonding member 6 includes a solder. In addition, the binder resin included in the wiring pattern 3 may be a resin of another type excluding the silicone type. Even in this case, the wiring pattern 3 and the bonding member 6 are adhered to each other via the metal foil 4.

The binder resin has bending and stretching properties. Since the wiring pattern 3 includes a binder resin and conductive particles, the wiring pattern 3 has bending and stretching properties. The planar size (mounting area) of the metal foil 4 is substantially the same as the planar size of the bonding member 6, or slightly larger than the planar size of the bonding member 6. Since the metal foil 4 may follow the bending of the substrate 2 or the wiring pattern 3 when the substrate 2 or the wiring pattern 3 is curved or bent, the bending and stretching properties of the board 1 are not impaired.

When the bonding member 6 includes a binder resin and conductive particles, the bonding member 6 has bending and stretching properties. Since the bonding member 6 may follow the bending of the substrate 2 or the wiring pattern 3 when the substrate 2 or the wiring pattern 3 is curved or bent, the bending and stretching properties of the board 1 are improved.

The metal foil 4, which has an electrical resistivity lower than the electrical resistivity of the wiring pattern 3, may be used. When the metal foil 4, which has the electrical resistivity lower than the electrical resistivity of the wiring pattern 3, is used, connection resistance is reduced, and the signal transmission speed between the wiring pattern 3 and the electronic component 5 is improved. When conductive particles included in the conductive paste 13 are silver particles, the electrical resistivity of the wiring pattern 3 or the conductive paste 13 is about $1 \times 10^{-3}$ to $10^{-5}$ $\Omega \cdot cm$. When conductive particles included in the conductive paste 13 are any metal particles other than silver particles, the electrical resistivity of the wiring pattern 3 or the conductive paste 13 is higher than about $1 \times 10^{-3}$ to $10^{-5}$ $\Omega \cdot cm$. The electrical resistivity of silver is $1.59 \times 10^{-6}$ $\Omega \cdot cm$, the electrical resistivity of copper is $1.68 \times 0^{-6}$ $\Omega \cdot cm$, the electrical resistivity of gold is $2.21 \times 10^{-6}$ $\Omega \cdot cm$, the electrical resistivity of aluminum is $2.65 \times 10^{-6}$ $\Omega \cdot cm$, and the electrical resistivity of nickel is $6.99 \times 10^{-6}$ $\Omega \cdot cm$. Therefore, when a silver foil, a copper foil, a gold foil, an aluminum foil, or a nickel foil is used as the metal foil 4, the electrical resistivity of the metal foil 4 is lower than the electrical resistivity of the wiring pattern 3.

Figure 8A:
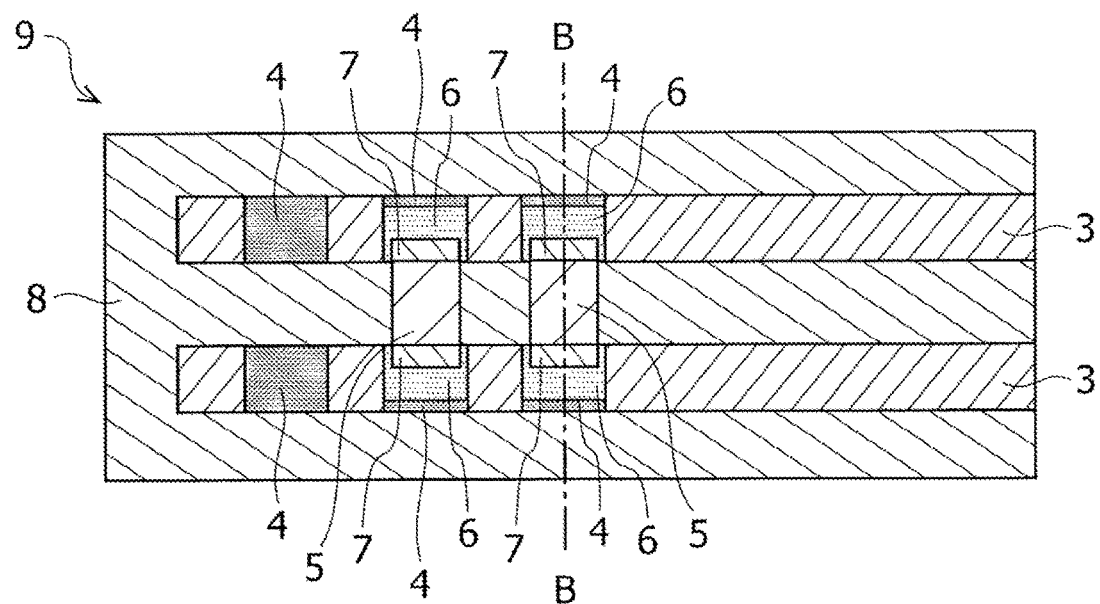
FIG. 8A is a plan view of an electronic device.
Figure 8B:
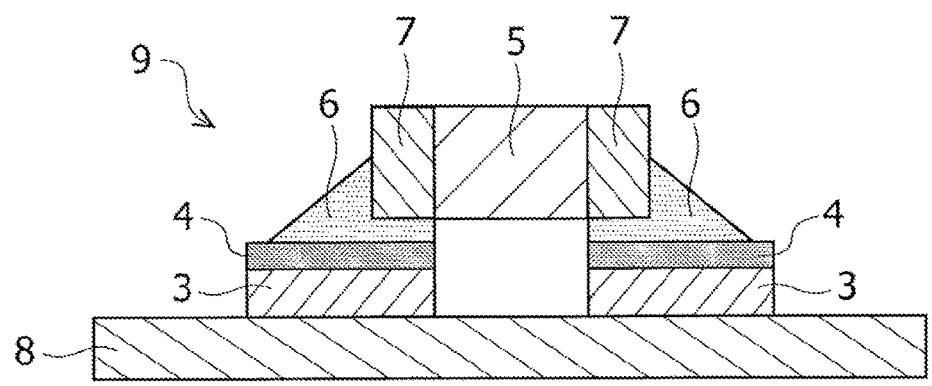
FIG. 8B is a cross-sectional view of the electronic device.

Various modifications, improvements, and the like may be made with respect to the first exemplary embodiment. For example, as illustrated in FIGS. 8A and 8B, the configuration of the first exemplary embodiment may be applied to an electronic device 9 that includes a board 8 having a bending property, the wiring pattern 3 formed on the board 8, the metal foil 4, the electronic component 5, and the bonding member 6. FIG. 8A is a plan view of the electronic device 9. FIG. 8B is a cross-sectional view of the electronic device 9, and illustrates the cross section taken along one-dot dashed line B-B in FIG. 8A. A material of the board 8 is, for example, an elastomer. The electronic device 9 is, for example, a wireless communication device (beacon) that transmits beacon signals, or a wearable terminal that may be used while being worn on a body.

<Second Exemplary Embodiment>

Figure 9:
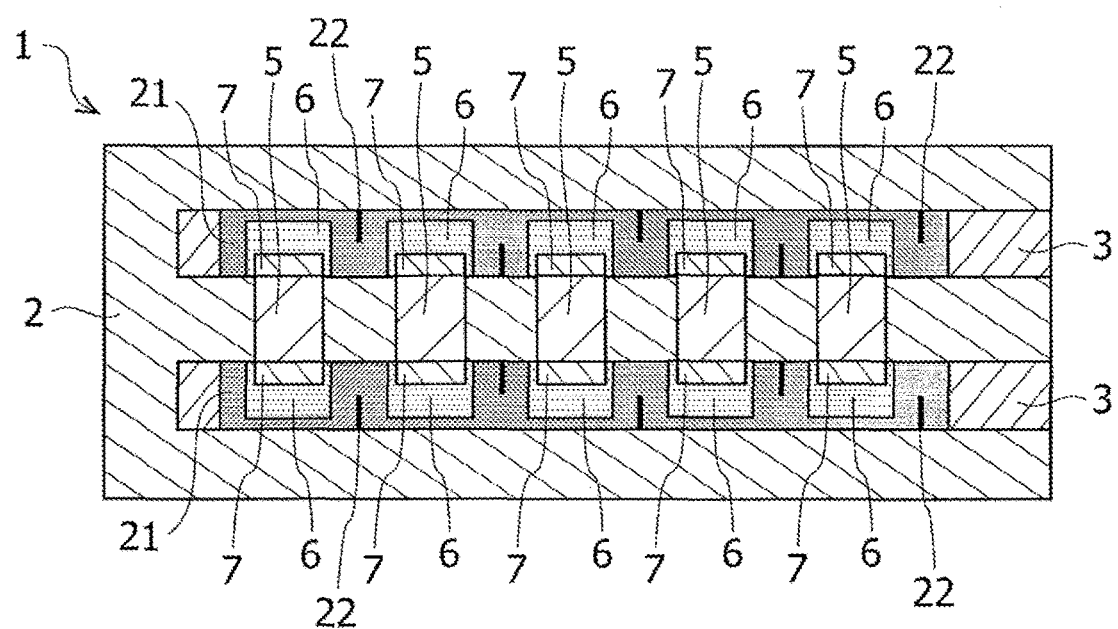
FIG. 9 is a plan view of the board.

A second exemplary embodiment will be described. The same constituent elements as those in the first exemplary embodiment will be given the same reference numerals as those in the first exemplary embodiment, and a description thereof will be omitted. FIG. 9 is a plan view of a board 1. The board 1 includes a substrate 2, a wiring pattern 3, a metal foil 21, an electronic component 5, and a bonding member 6. The metal foil 21 is an exemplary conductive member. The substrate 2, the wiring pattern 3, the electronic component 5, and the bonding member 6 are the same as those in the first exemplary embodiment. The metal foil 21 is formed on the wiring pattern 3. One metal foil 21 is formed on each wiring pattern 3. Multiple bonding members 6 are disposed on each metal foil 21. Examples of the metal foil 21 include a copper foil, a gold foil, a silver foil, an aluminum foil, a nickel foil, and a tin foil.

Multiple incisions (notches) 22 are formed in the outer peripheral portion of the metal foil 21. The incisions 22 extend from the outer peripheral portion to the central portion of the metal foil 21. The extending direction of the incisions 22 is the direction orthogonal to the longitudinal direction of the metal foil 21. In the example illustrated in FIG. 9, each incision 22 is disposed between multiple electronic components 5. The incisions 22 are provided on two opposite sides of the metal foil 21, respectively. The board 1 according to the second exemplary embodiment may be manufactured by the same processes as those in the method of manufacturing the board 1 according to the first exemplary embodiment.

Figure 10:
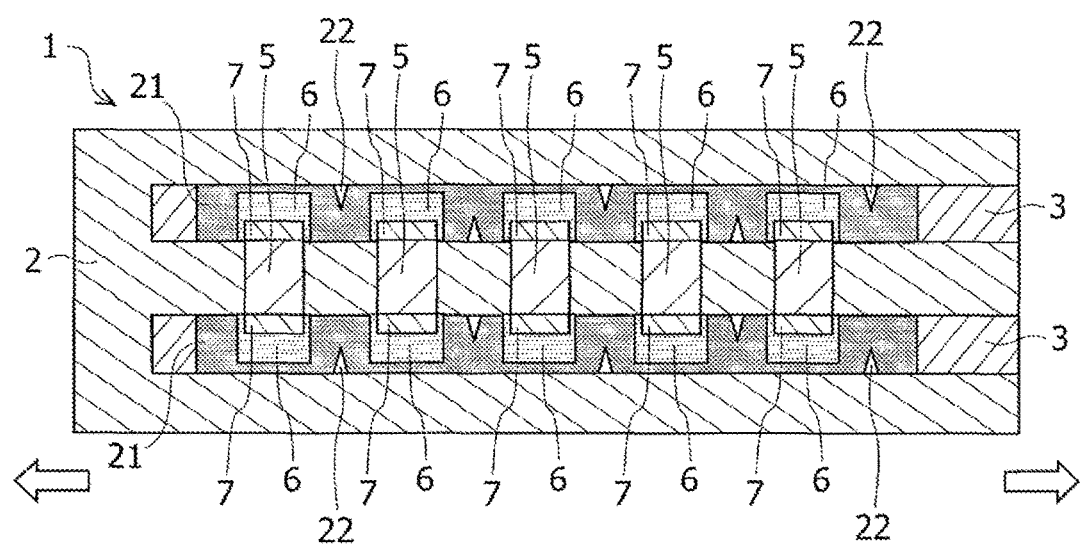
FIG. 10 is a plan view of the board.

FIG. 10 is a plan view of the board 1. FIG. 10 illustrates the board 1 in a state where both end portions of the substrate 2 are pulled in the longitudinal direction of the substrate 2. When the end portions of the substrate 2 are pulled, the wiring pattern 3 is pulled in the longitudinal direction of the wiring pattern 3. When the wiring pattern 3 is pulled, a gap between the incisions 22 of the metal foil 21 is increased. For example, when the substrate 2 is curved and the wiring pattern 3 is pulled, the gap between the incisions 22 of the metal foil 21 is increased. When the gap between the incisions 22 of the metal foil 21 is increased, the metal foil 21 may follow the bending of the substrate 2 or the wiring pattern 3, and the bending property of the board 1 is not impaired. For example, in a case where the metal foil 21 having high rigidity is formed on the wiring pattern 3, the metal foil 21 may follow the bending of the substrate 2 or the wiring pattern 3 when the substrate 2 or the wiring pattern 3 is curved or bent.

In the same manner as in the first exemplary embodiment, the metal foil 21, which has an electrical resistivity lower than the electrical resistivity of the wiring pattern 3, may be used. When the metal foil 21, which has an electrical resistivity lower than the electrical resistivity of the wiring pattern 3, is used, connection resistance is reduced and the signal transmission speed between the wiring pattern 3 and the electronic component 5 is improved. Various modifications, improvements, and the like of the second exemplary embodiment are possible. For example, the configuration of the second exemplary embodiment may be applied to the electronic device 9 that includes the board 8 having bendability, the wiring pattern 3 formed on the board 8, the metal foil 21, the electronic component 5, and the bonding member 6.

<Third Exemplary Embodiment>

Figure 11A:
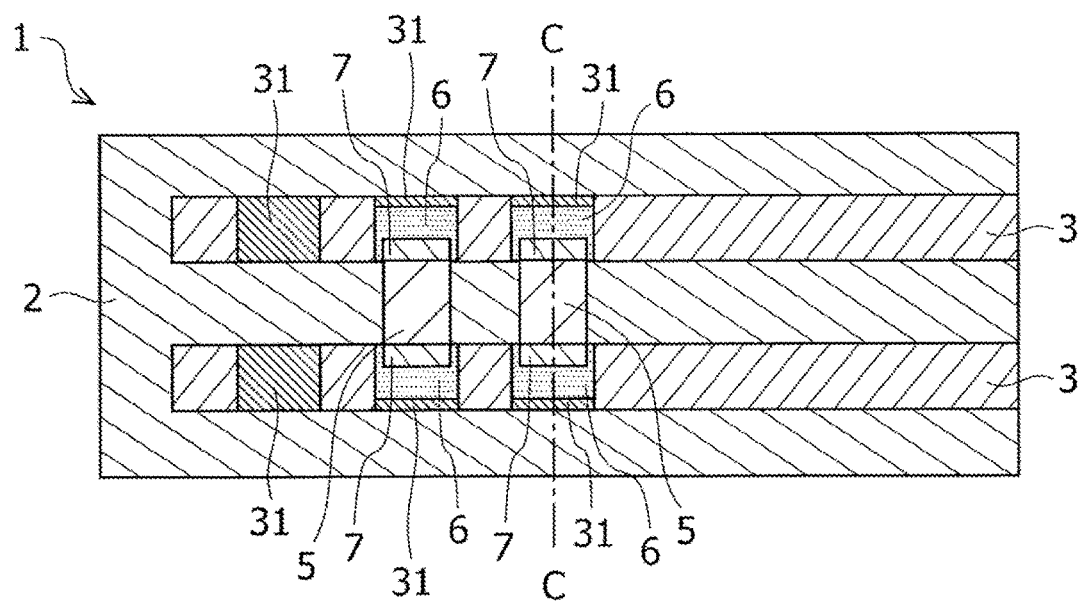
FIG. 11A is a plan view of the board.
Figure 11B:
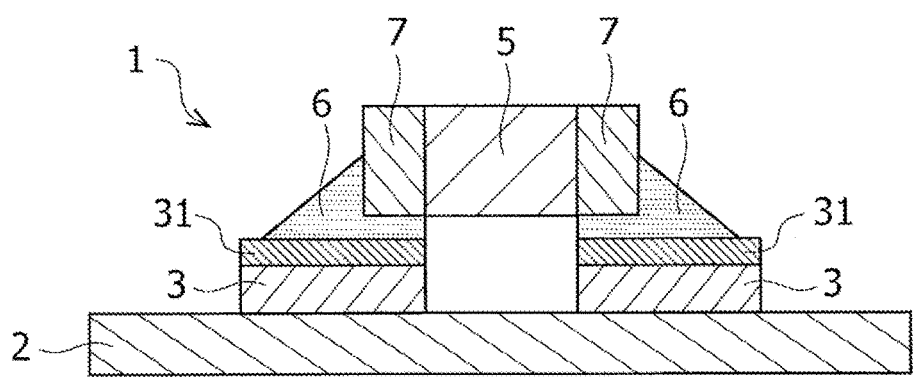
FIG. 11B is a cross-sectional view of the board.

A third exemplary embodiment will be described. The same constituent elements as those in the first exemplary embodiment will be given the same reference numerals as those in the first exemplary embodiment, and a description thereof will be omitted. FIG. 11A is a plan view of a board 1. FIG. 11B is a cross-sectional view of the board 1, and illustrates the cross section taken along one-dot dashed line C-C in FIG. 11A. The board 1 includes a substrate 2, a wiring pattern 3, a metal plating 31, an electronic component 5, and a bonding member 6. The metal plating 31 is an example of a conductive member. The substrate 2, the wiring pattern 3, the electronic component 5, and the bonding member 6 are the same as those in the first exemplary embodiment.

The metal plating 31 is formed on the wiring pattern 3. One metal plating 31 may be formed on each wiring pattern 3, or multiple metal platings 31 may be formed on each wiring pattern 3. In a case where multiple metal platings 31 are formed on each wiring pattern 3, the multiple metal platings 31 may be spaced apart from each other. The metal plating 31 is formed of, for example, a metal such as silver, copper, gold, aluminum, nickel, or tin, or an alloy including any one of silver, copper, gold, aluminum, nickel, and tin. Although the metal plating 31 has a rectangular shape in a plan view in the example illustrated in FIGS. 11A and 11B, the present disclosure is not limited to the example illustrated in FIGS. 11A and 11B, and the metal plating 31 may have a circular or elliptical shape in a plan view.

A method of manufacturing the board 1 according to the third exemplary embodiment differs from the method of manufacturing the board 1 according to the first exemplary embodiment in terms of the following processes. In the method of manufacturing the board 1 according to the third exemplary embodiment, the multiple conductive pastes 13 are formed on the substrate 2, and then, the multiple conductive pastes 13 are cured by performing a heating processing. Therefore, the multiple conductive pastes 13 are formed on the substrate 2. Subsequently, the multiple metal platings 31 are formed on each wiring pattern 3 by an electrolytic plating method or an electroless plating method. The other processes in the method of manufacturing the board 1 according to the third exemplary embodiment are the same as those in the first exemplary embodiment.

Regardless of the type of a binder resin included in the wiring pattern 3, the metal plating 31 has high adhesiveness to the wiring pattern 3. In a case where the bonding member 6 includes a binder resin and conductive particles, the metal plating 31 has high adhesiveness to the bonding member 6 regardless of the type of a binder resin included in the bonding member 6. The metal plating 31 has good solder wettability. In a case where the bonding member 6 includes a solder, the metal plating 31 has high adhesiveness to the bonding member 6. Thus, when the metal plating 31 is interposed between the wiring pattern 3 and the bonding member 6, the wiring pattern 3 and the bonding member 6 are adhered to each other, and the bonding between the wiring pattern 3 and the terminals 7 of the electronic component 5 is secured.

In a case where the bonding member 6 includes a binder resin and conductive particles, the type of a binder resin included in the wiring pattern 3 and the type of a binder resin included in the bonding member 6 may be made different from each other by disposing the metal plating 31 between the wiring pattern 3 and the bonding member 6. In the same manner as in the first exemplary embodiment, the electronic component 5 may be mounted on the substrate 2 regardless of the type of the conductive paste.

Since the wiring pattern 3 includes a binder resin and conductive particles, the wiring pattern 3 has bending and stretching properties. The planar size (mounting area) of the metal plating 31 is substantially the same as the planar size of the bonding member 6, or slightly larger than the planar size of the bonding member 6. Since the metal plating 31 may follow the bending of the substrate 2 or the wiring pattern 3 when the substrate 2 or the wiring pattern 3 is curved or bent, the bending and stretching properties of the board 1 are not impaired.

In the same manner as in the first exemplary embodiment, a metal plating 31, which has an electrical resistivity smaller than the electrical resistivity of the wiring pattern 3, may be used. When the metal plating 31, which has an electrical resistivity smaller than the electrical resistivity of the wiring pattern 3, is used, connection resistance is reduced, and the signal transmission speed between the wiring pattern 3 and the electronic component 5 is improved. Various modifications, improvements, and the like of the third exemplary embodiment are possible. For example, the configuration of the third exemplary embodiment may be applied to the electronic device 9 that includes the board 8 having a bending property, the wiring pattern 3 formed on the board 8, the metal plating 31, the electronic component 5, and the bonding member 6.

<Fourth Embodiment>

Figure 12A:
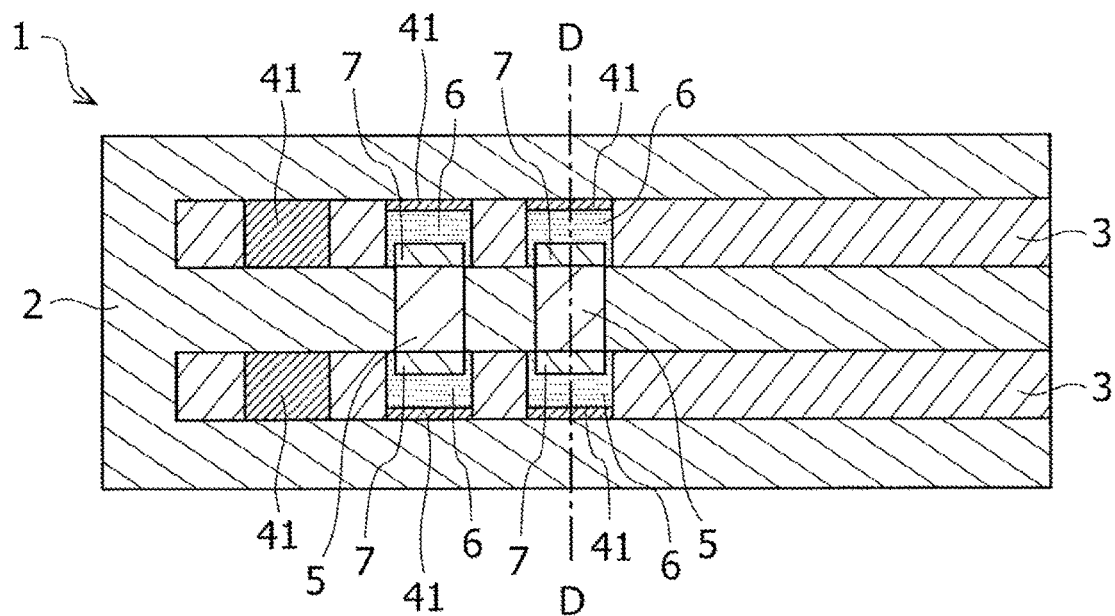
FIG. 12A is a plan view of the board.
Figure 12B:
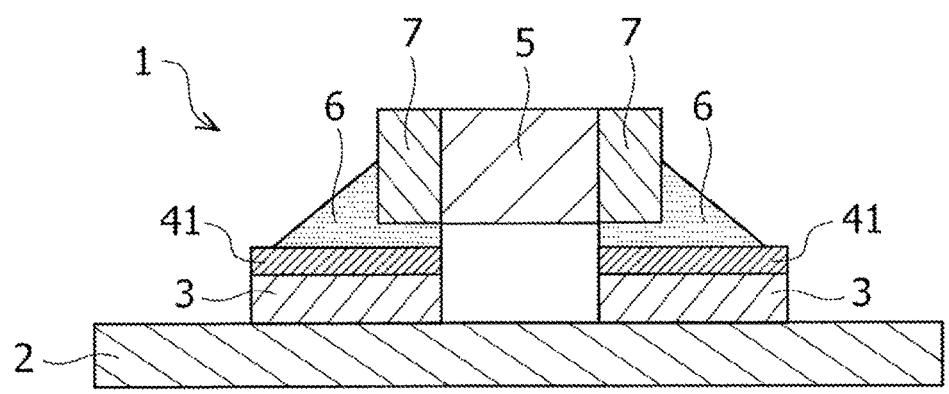
FIG. 12B is a cross-sectional view of the board.

The fourth embodiment will be described. The same constituent elements as those in the first exemplary embodiment will be given the same reference numerals as those in the first exemplary embodiment, and a description thereof will be omitted. FIG. 12A is a plan view of the board 1. FIG. 12B is a cross-sectional view of a board 1, and shows the cross section taken along one-dot dashed line D-D in FIG. 12A. The board 1 includes a substrate 2, a wiring pattern 3, a metal powder 41, an electronic component 5, and a bonding member 6. The metal powder 41 is an exemplary conductive member. The substrate 2, the wiring pattern 3, the electronic component 5, and the bonding member 6 are the same as those in the first exemplary embodiment.

The metal powder 41 is formed on the wiring pattern 3. One metal powder 41 may be formed on each wiring pattern 3, or multiple metal powders 41 may be formed on each wiring pattern 3. When multiple metal powders 41 are formed on each wiring pattern 3, the multiple metal powders 41 are spaced apart from each other. The metal powder 41 is, for example, silver powder, copper powder, gold powder, aluminum powder, nickel powder, or tin powder. Although the metal powder 41 has a rectangular shape in a plan view in the example illustrated in FIGS. 12A and 12B, the present disclosure is not limited to the example illustrated in FIGS. 12A and 12B, and the metal powder 41 may have a circular or elliptical shape in a plan view.

A method of manufacturing the board 1 according to the fourth exemplary embodiment may include the same processes as those in the method of manufacturing the board 1 according to the first exemplary embodiment. The process of forming the multiple metal powders 41 on each conductive paste 13 is performed instead of the process of forming the multiple metal foils 4 on each conductive paste 13 of the first exemplary embodiment. The other processes in the method of manufacturing the board 1 according to the fourth exemplary embodiment are the same as those in the first exemplary embodiment.

Regardless of the type of a binder resin included in the wiring pattern 3, the metal powder 41 has high adhesiveness to the wiring pattern 3. In a case where the bonding member 6 includes a binder resin and conductive particles, the metal powder 41 has high adhesiveness to the bonding member 6 regardless of the type of a binder resin included in the bonding member 6. The metal powder 41 has good solder wettability. When the bonding member 6 includes a solder, the metal powder 41 has high adhesiveness to the bonding member 6. Thus, when the metal powder 41 is interposed between the wiring pattern 3 and the bonding member 6, the wiring pattern 3 and the bonding member 6 are adhered to each other, and the bonding between the wiring pattern 3 and the terminals 7 of the electronic component 5 is secured.

In a case where the bonding member 6 includes a binder resin and conductive particles, the type of a binder resin included in the wiring pattern 3 and the type of a binder resin included in the bonding member 6 may be made different from each other by disposing the metal powder 41 between the wiring pattern 3 and the bonding member 6. In the same manner as in the first exemplary embodiment, regardless of the type of the conductive paste, the electronic component 5 may be mounted on the substrate 2.

Since the wiring pattern 3 includes a binder resin and conductive particles, the wiring pattern 3 has bending and stretching properties. The planar size (mounting area) of the metal powder 41 is substantially the same as the planar size of the bonding member 6, or slightly larger than the planar size of the bonding member 6. Since the metal powder 41 may follow the bending of the substrate 2 or the wiring pattern 3 when the substrate 2 or the wiring pattern 3 is curved or bent, the bending and stretching properties of the board 1 are not impaired.

In the same manner as in the first exemplary embodiment, the metal powder 41, which has an electrical resistivity lower than the electrical resistivity of the wiring pattern 3, may be used. When the metal powder 41, which has an electrical resistivity lower than the electrical resistivity of the wiring pattern 3, is used, connection resistance is reduced, and the signal transmission speed between the wiring pattern 3 and the electronic component 5 is improved. Various modifications, improvements, and the like of the fourth exemplary embodiment are possible. For example, the configuration of the fourth exemplary embodiment may be applied to the electronic device 9 that includes the board 8 having a bending property, the wiring pattern 3 formed on the board 8, the metal powder 41, the electronic component 5, and the bonding member 6.

In the first to fourth exemplary embodiments, the bonding member 6 may be formed by curing a solder paste. The heating temperature at the time of curing the solder paste is lower than the heating temperature at the time of curing a conductive paste. Therefore, when the bonding member 6 is formed by curing the solder paste, the bonding temperature may be lowered. When the bonding temperature is lowered, thermal stress at the time of bonding may be suppressed, and warpage of the board 1 may be reduced.

In the first to fourth exemplary embodiments, the conductive paste 13, which is used as a material of the wiring pattern 3, may be selected from among multiple types of conductive paste 13. In the first to fourth exemplary embodiments, a conductive paste, which is used as a material of the bonding member 6, may be selected from among multiple kinds of conductive paste. For example, the bonding time may be reduced by selecting a conductive paste having a short curing time from among multiple types of conductive paste. For example, cost reduction of the board 1 may be achieved by selecting a low-cost conductive paste from among multiple types of conductive paste. For example, the low-cost conductive paste 13 may be selected as a material of the wiring pattern 3, and a conductive paste having a short curing time may be selected as a material of the bonding member 6. Therefore, according to the first to fourth exemplary embodiments, the degree of freedom of the manufacturing process and the degree of freedom of design are improved.

<Fifth Exemplary Embodiment>

Figure 13A:
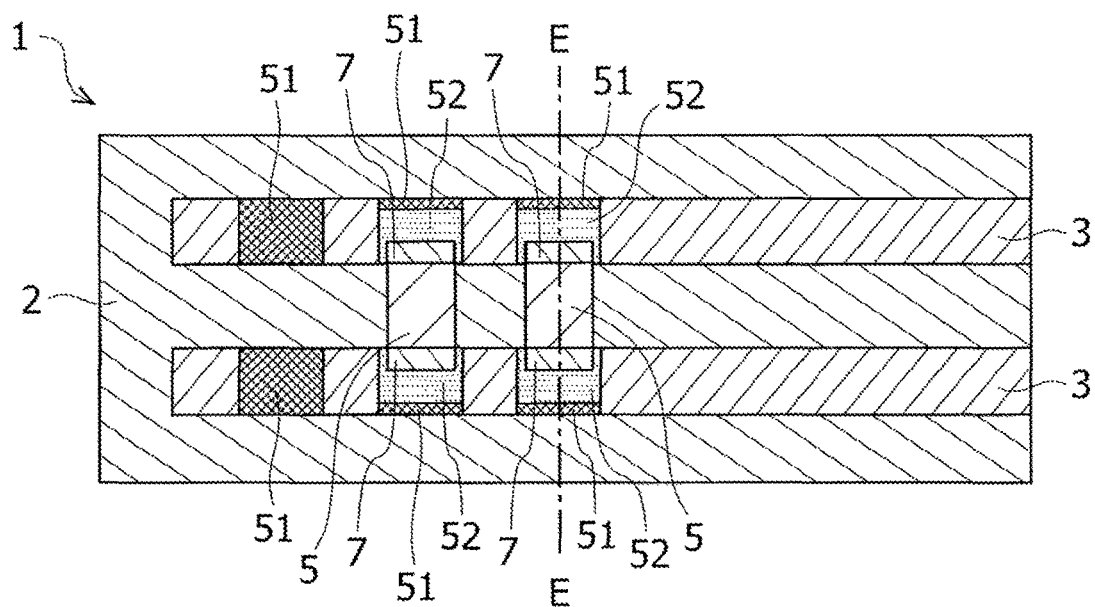
FIG. 13A is a plan view of the board.
Figure 13B:
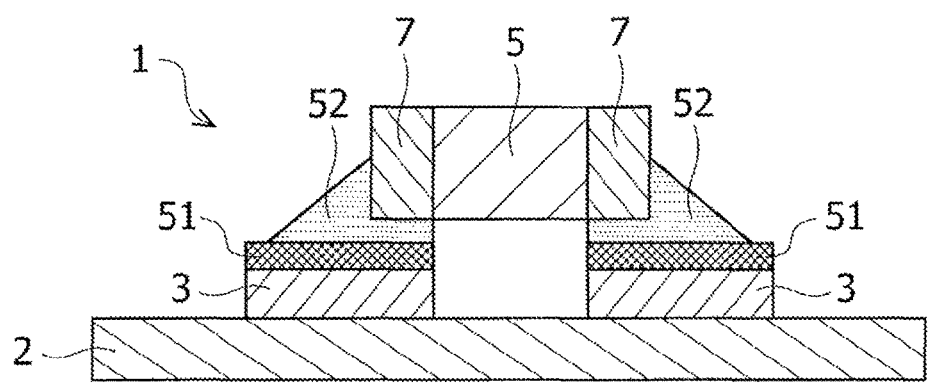
FIG. 13B is a cross-sectional view of the board.

A fifth embodiment will be described. The same constituent elements as those in the first exemplary embodiment will be given the same reference numerals as those in the first exemplary embodiment, and a description thereof will be omitted. FIG. 13A is a plan view of the board 1. FIG. 13B is a cross-sectional view of a board 1, and illustrates the cross section taken along one-dot dashed line E-E in FIG. 13A. The board 1 includes a substrate 2, a wiring pattern 3, a conductor 51, an electronic component 5, and a bonding member 52. The conductor 51 is an exemplary conductive member. The substrate 2, the wiring pattern 3 and the electronic component 5 are the same as those in the first exemplary embodiment.

The conductor 51 is formed on the wiring pattern 3. One conductor 51 may be formed on each wiring pattern 3, or multiple conductors 51 may be formed on each wiring pattern 3. When the multiple conductors 51 are formed on each wiring pattern 3, the multiple conductors 51 are spaced apart from each other. Although the conductor 51 has a rectangular shape in a plan view in the example illustrated in FIGS. 13A and 13B, the present disclosure is not limited to the example illustrated in FIGS. 13A and 13B, and the conductor 51 may have a circular or elliptical shape in a plan view.

The bonding member 52 is formed between the conductor 51 and the electronic component 5 to bond the electric conductor 51 and the terminals 7 of the electronic component 5. The wiring pattern 3 and the electronic component 5 are electrically connected to each other via the conductor 51 and the connection member 52.

<Method of manufacturing Board 1>

Figure 14A:
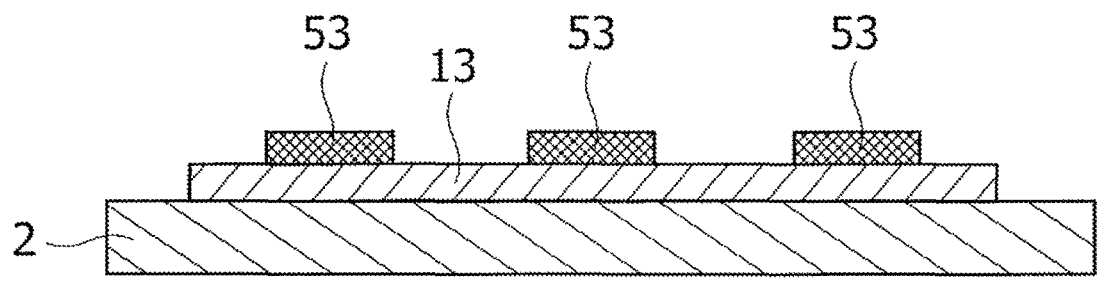
FIG. 14A is a cross-sectional view of the substrate.
Figure 14B:
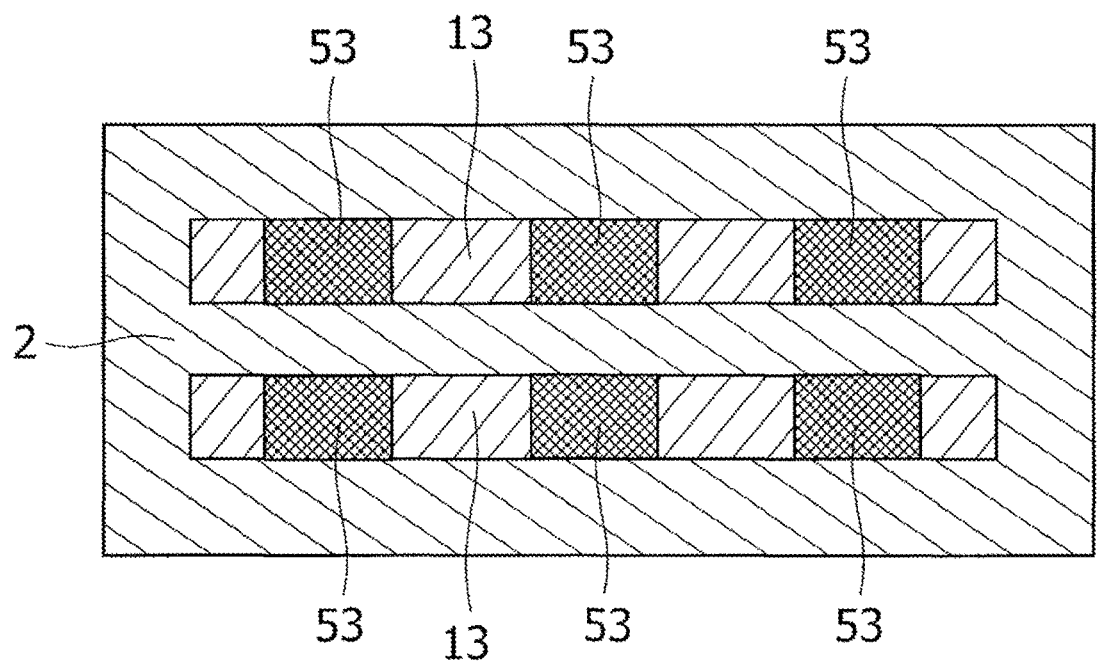
FIG. 14B is a plan view of the substrate.

An example of the board 1 according to the fifth exemplary embodiment will be described with reference to FIGS. 14A to 18B. After the substrate 2 is disposed, multiple conductive pastes 13 are formed on the substrate 2. The process of forming the multiple conductive pastes 13 on the substrate 2 is the same as in the first exemplary embodiment. Subsequently, as illustrated in FIGS. 14A and 14B, the multiple conductive pastes 53 are formed on each conductive paste 13. FIG. 14A is a cross-sectional view of the substrate 2, and FIG. 14B is a plan view of the substrate 2.

The conductive paste 53 is a conductive resin including a binder resin and conductive particles. Examples of the binder resin include a silicone-based resin, an epoxy-based resin, a urethane-based resin, a polyester-based resin, an acryl-based resin, and a modified silicone-based resin. Examples of the conductive particles include metal particles such as copper particles, gold particles, silver particles, palladium particles, nickel particles, tin particles, and lead particles, or a combination of two or more of these metal particles. The type of a binder resin included in the conductive paste 13 differs from the type of a binder resin included in the conductive paste 53. For example, the binder resin included in the conductive paste 13 may be a silicone-based resin, and the binder resin included in the conductive paste 53 may be an epoxy-based resin.

Figure 15A:
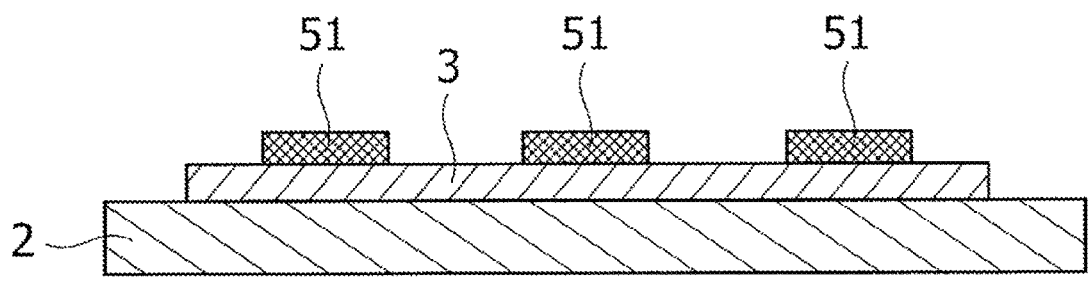
FIG. 15A is a cross-sectional view of the substrate.
Figure 15B:
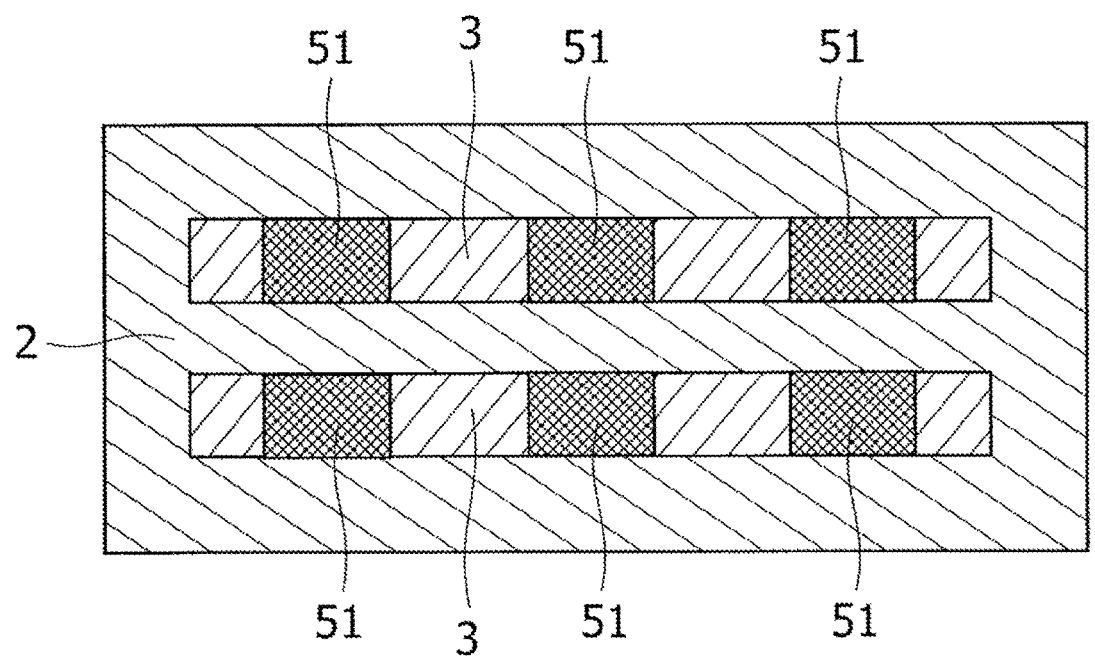
FIG. 15B is a plan view of the substrate.

Subsequently, the conductive paste 13 and the conductive paste 53 are simultaneously cured by performing a heating processing. That is, the conductive paste 13 and the conductive paste 53 are cured by the same heating processing process. As illustrated in FIGS. 15A and 15B, multiple wiring patterns 3 are formed on the substrate 2 by curing the multiple conductive pastes 13, and multiple conductors 51 are formed on each wiring pattern 3 by curing the multiple conductive pastes 53. FIG. 15A is a cross-sectional view of the substrate 2, and FIG. 15B is a plan view of the substrate 2. The wiring pattern 3 and the conductor 51 are adhered to each other by curing the conductive paste 13 and the conductive paste 53 at the same time such that the conductive paste 13 and the conductive paste 53 are in contact with each other. That is, the wiring pattern 3 and the conductor 51 are formed on the substrate 2 such that the wiring pattern 3 and the conductor 51 are in close contact with each other.

The wiring pattern 3 is formed by curing the conductive paste 13 that includes a binder resin and conductive particles. Thus, the wiring pattern 3 includes a binder resin and conductive particles. The conductor 51 is formed by curing the conductive paste 53 that includes a binder resin and conductive particles. Thus, the conductor 51 includes a binder resin and conductive particles. The type of a binder resin included in the conductive paste 13 differs from the type of a binder resin included in the conductive paste 53. Therefore, the type of a binder resin included in the wiring pattern 3 differs from the type of a binder resin included in the conductor 51. Since the type of a binder resin included in the conductive paste 13 differs from the type of a binder resin included in the conductive paste 53, the adhesiveness between the conductive paste 13 and the conductive paste 53 is low. However, when the conductive paste 13 and the conductive paste 53 are cured at the same time, the adhesiveness between the wiring pattern 3 and the conductor 51 is high since the adhesiveness between the conductive paste 13 and the conductive paste 53 is improved.

Figure 16A:
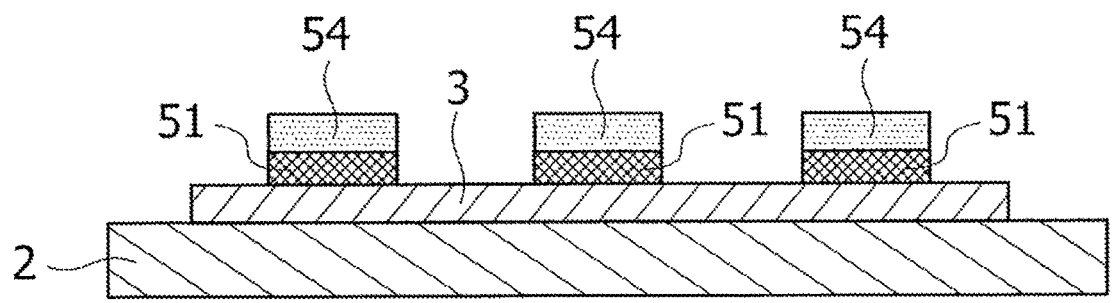
FIG. 16A is a cross-sectional view of the substrate.
Figure 16B:
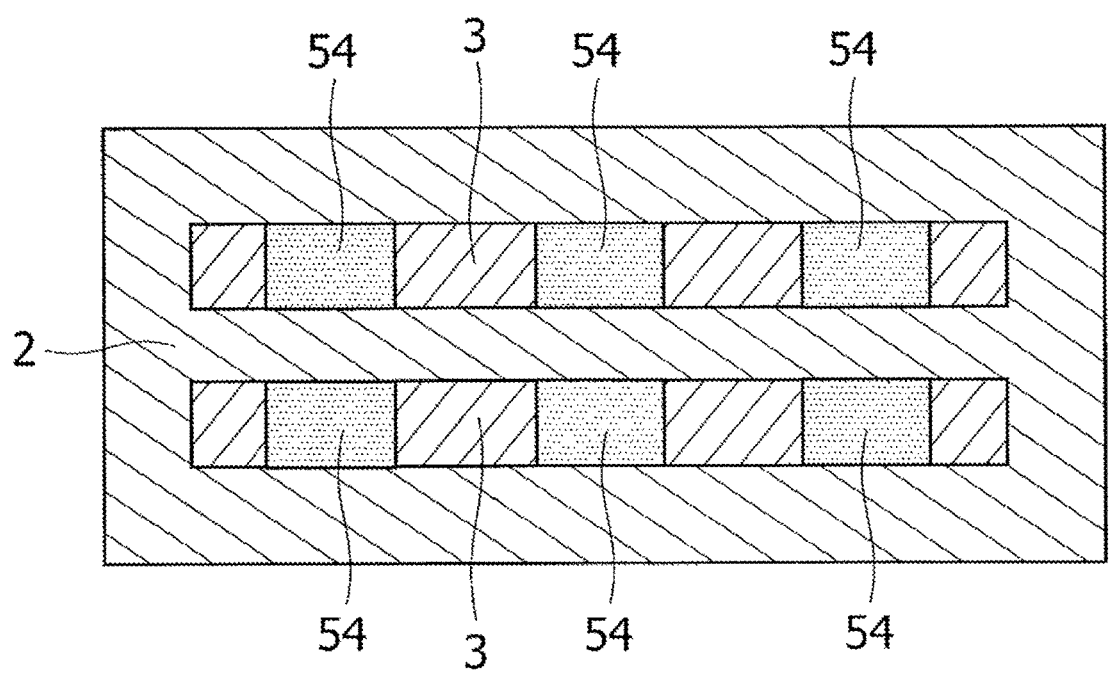
FIG. 16B is a plan view of the substrate.

Subsequently, as illustrated in FIGS. 16A and 16B, a conductive paste 54 is formed on each conductor 51. FIG. 16A is a cross-sectional view of the substrate 2, and FIG. 16B is a plan view of the substrate 2. For example, a conductive paste 54 may be formed on each conductor 51 by dispensing application or printing application.

The conductive paste 54 is a conductive resin that includes a binder resin and conductive particles. Examples of the binder resin include a silicone-based resin, an epoxy-based resin, a urethane-based resin, a polyester-based resin, an acryl-based resin, and a modified silicone-based resin. Examples of the conductive particles include metal particles such as copper particles, gold particles, silver particles, palladium particles, nickel particles, tin particles, and lead particles, or a combination of two or more of these metal particles. The type of a binder resin included in the conductive paste 53 is the same as the type of a binder resin included in the conductive paste 54.

Figure 17A:
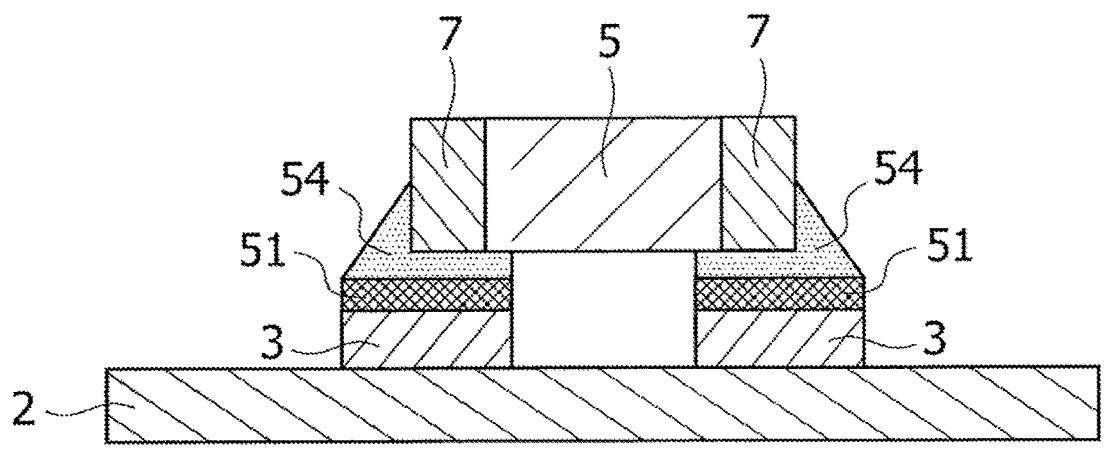
FIG. 17A is a cross-sectional view of the board.
Figure 17B:
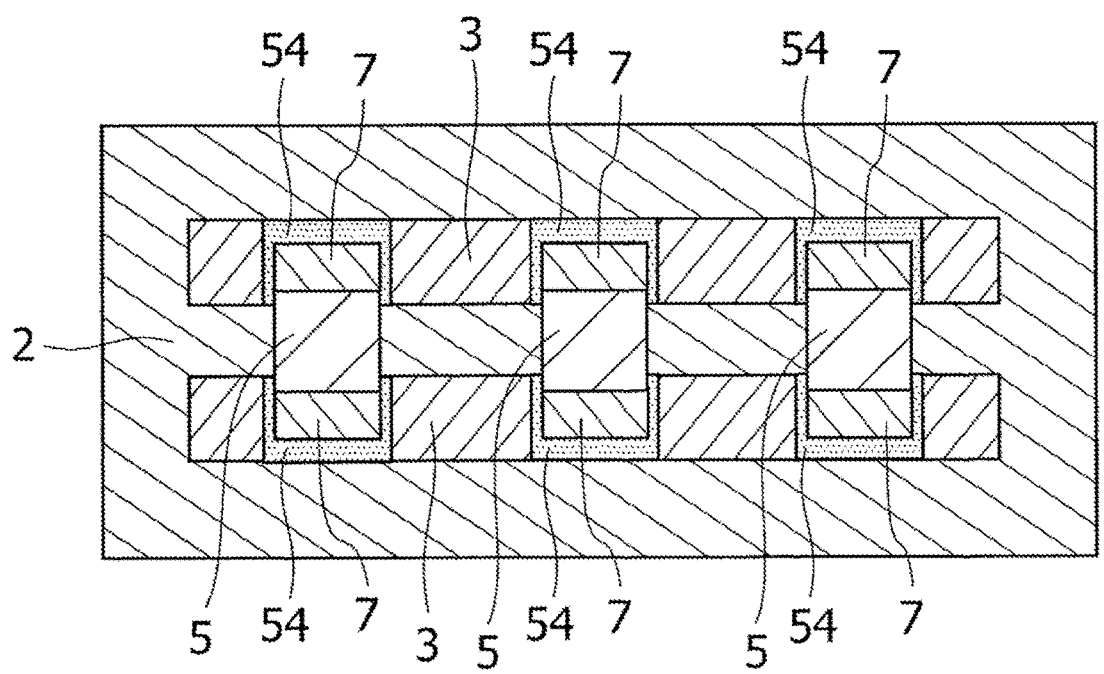
FIG. 17B is a plan view of the board.
Figure 18A:
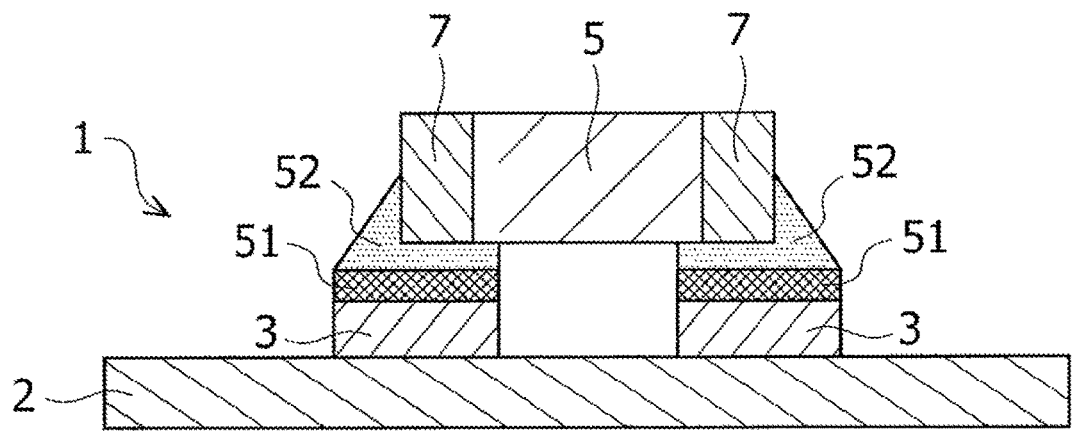
FIG. 18A is a cross-sectional view of the board.
Figure 18B:
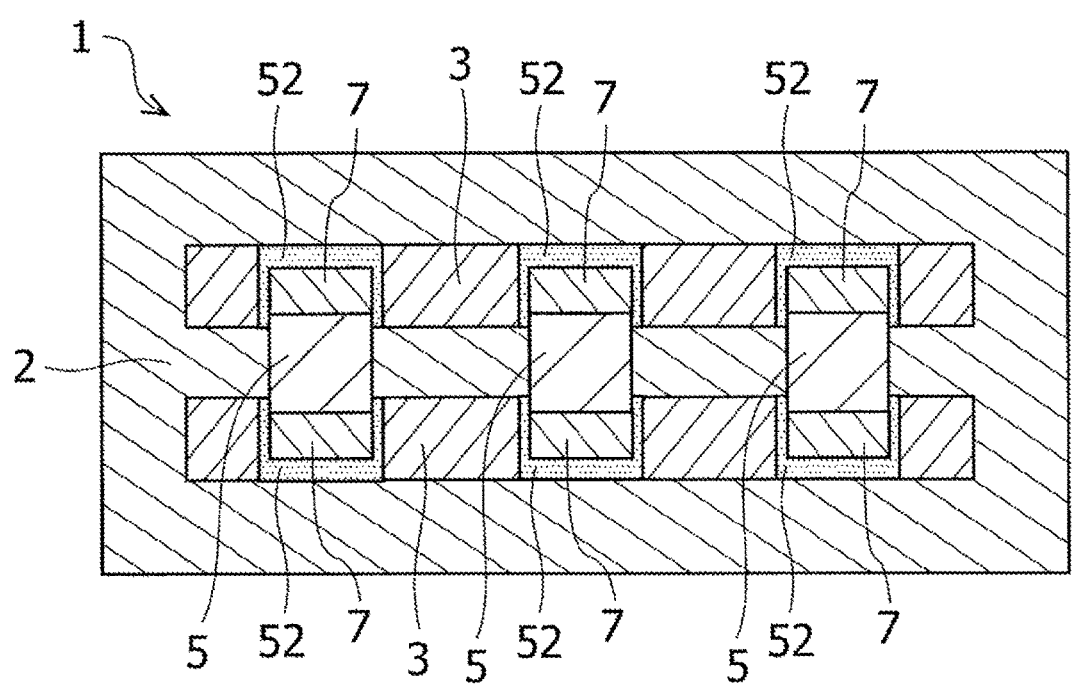
FIG. 18B is a plan view of the board.
Figure 19:
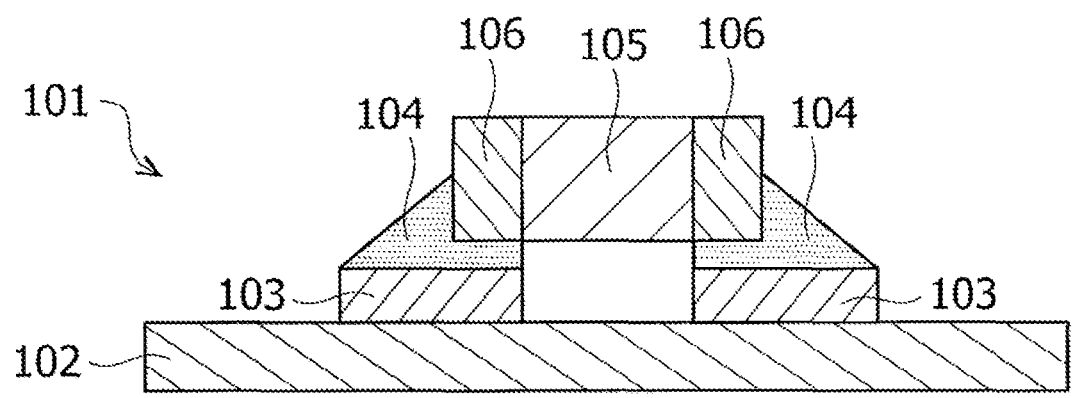
FIG. 19 is an explanatory view of the board.

Subsequently, as illustrated in FIGS. 17A and 17B, multiple electronic components 5 are mounted on the substrate 2. FIG. 17A is a cross-sectional view of the substrate 2, and FIG. 17B is a plan view of the substrate 2. For example, the multiple electronic components 5 are disposed so that the terminals 7 of each electronic component 5 are positioned on the conductive paste 54. Subsequently, the conductive paste 54 is cured by performing a heating processing. As illustrated in FIGS. 18A and 18B, the bonding member 52 is formed between the conductor 51 and the electronic component 5 to bond the electric conductor 51 and the terminals 7 of the electronic component 5 by curing the conductive paste 54. FIG. 18A is a cross-sectional view of the substrate 2, and FIG. 18B is a plan view of the substrate 2. The board 1 is manufactured by performing the processes illustrated in FIGS. 14A to 18B.

The bonding member 52 is formed by curing the conductive paste 54 that includes a binder resin and conductive particles. Thus, the bonding member 52 includes a binder resin and conductive particles. Since the type of a binder resin included in the conductive paste 53 is the same as the type of a binder resin included in the conductive paste 54, the type of a binder resin included in the conductor 51 is the same as the type of a binder resin included in the bonding member 52. Thus, the adhesiveness between the conductor 51 and the bonding member 52 is high.

The type of a binder resin included in the winding pattern 3 differs from the type of a binder resin included in the conductor 51. Thus, the type of a binder resin included in the conductor 51 differs from the type of a binder resin included in the bonding member 52. Thus, the type of a binder resin included in the wiring pattern 3 differs from the type of a binder resin included in the bonding member 52. Since the kind of a binder resin included in the conductor 51 is the same as the kind of a binder resin included in the bonding member 52, the conductor 51 and the bonding member 52 have high adhesiveness regardless of the type of a binder resin included in the wiring pattern 3. Therefore, when the conductor 51 is interposed between the wiring pattern 3 and the bonding member 52, the wiring pattern 3 and the bonding member 52 are adhered to each other, and the bonding between the wiring pattern 3 and the terminals 7 of the electronic component 5 is secured.

The type of a binder resin included in the wiring pattern 3 and the type of a binder resin included in the bonding member 52 may be made different from each other by disposing the conductor 51 between the wiring pattern 3 and the bonding member 52. Thus, the binder resin included in the wiring pattern 3 and the binder resin included in the bonding member 52 may be selected from among multiple types of binder resins, respectively. Therefore, the binder resin included in the conductive paste 13 and the binder resin included in the conductive paste 54 may be selected from among multiple types of binder resins, respectively. In this way, the electronic component 5 may be mounted on the substrate 2 regardless of the type of a binder resin. A conductive paste, which is used as a material of the wiring pattern 3, may be selected from among multiple types of conductive paste. A conductive paste, which is used as a material of the bonding member 52, may be selected from among multiple types of conductive paste.

For example, the binder resin included in the wiring pattern 3 may be a silicone-based resin and the binder resin included in the bonding member 52 may be an epoxy-based resin. Since the silicone-based resin and the epoxy-based resin are different types of resins, the adhesiveness between the silicone-based resin and the epoxy-based resin is low. The board 1 has the conductor 51 between the wiring pattern 3 and the bonding member 52. Therefore, even if the type of a binder resin included in the wiring pattern 3 differs from the type of a binder resin included in the bonding member 52, the wiring pattern 3 and the bonding member 52 are bonded to each other via the conductor 51.

The conductive paste 13, which is used as a material of the wiring pattern 3, may be selected from among multiple types of conductive paste 13. The conductive paste 53, which is used as a material of the conductor 51, may be selected from among multiple types of conductive paste 53. The conductive paste 54, which is used as a material of the bonding member 52, may be selected from among multiple types of conductive paste 54. For example, the bonding time may be reduced by selecting a conductive paste having a short curing time from among multiple types of conductive paste. For example, cost reduction of the board 1 may be achieved by selecting a low-cost conductive paste from multiple types of conductive paste. For example, the low-cost conductive paste 13 may be selected as a material of the wiring pattern 3 and the conductive paste 54 having a short curing time may be selected as a material of the bonding member 52. Therefore, according to the fifth exemplary embodiment, the degree of freedom of the manufacturing process or the degree of freedom of design are improved.

Various modifications, improvements, and the like are possible with respect to the fifth exemplary embodiment. For example, the configuration of the fifth exemplary embodiment may be applied to the electronic device 9 that includes the board 8 having a bending property, the wiring pattern 3 formed on the board 8, the conductor 51, the electronic component 5, and the bonding member 52.

All examples and conditional language recited herein are intended for pedagogical purposes to aiding the reader in understanding the invention and the concepts contributed by the inventor to furthering the art, and are not to be construed as limitation to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A board comprising:
   a substrate having a bending property as well as a stretching property;
   a wiring pattern formed over the substrate and having a bending property as well as a stretching property;
   a conductive member formed over a portion of the wiring pattern;
   a bonding member formed over the conductive member and having a bending property as well as a stretching property; and
   an electronic component mounted on the bonding member through a terminal,
   wherein the conductive member formed over the portion of the wiring pattern separates the wiring pattern from the bonding member,
   the wiring pattern contains a first resin and the bonding member contains a second resin having a different type from the first resin, and
   the bonding member bonds the conductive member and the terminal of the electronic component to each other such that the substrate, the wiring pattern, and the bonding member are capable of being curved and stretched.

2. The board according to claim 1, wherein the wiring pattern includes the first resin and conductive particles, the conductive member is a metal foil, metal plating, or metal powder, and the bonding member includes the second resin and conductive particles, or the bonding member includes a solder.

3. The board according to claim 1, wherein the conductive member is a metal foil, and an incision is formed in an outer peripheral portion of the metal foil.

4. The board according to claim 1, wherein the conductive member is a metal foil, metal plating, or metal powder, and an electrical resistivity of the metal foil, the metal plating, and the metal powder is smaller than an electrical resistivity of the wiring pattern.

5. The board according to claim 1, wherein the wiring pattern includes a resin and conductive particles, the conductive member includes a resin and conductive particles, the bonding member includes a resin and conductive particles, the resin included in the wiring pattern is different in type from the resin included in the bonding member, and the resin included in the wiring pattern is identical in type to the resin included in the bonding member.

6. An electronic device comprising:
   a board including a substrate and having a bending property as well as a stretching property;
   a wiring pattern formed over the substrate, the wiring pattern having a bending property as well as a stretching property;
   a conductive member formed over a portion of the wiring pattern;
   a bonding member formed over the conductive member and having a bending property as well as a stretching property; and
   an electronic component mounted on the bonding member through a terminal,
   wherein the conductive member formed over the portion of the wiring pattern separates the wiring pattern from the bonding member,
   the wiring pattern contains a first resin and the bonding member contains a second resin having a different type from the first resin, and the bonding member bonds the conductive member and the electronic component to each other such that the substrate, the wiring pattern, and the bonding member are capable of being curved and stretched.

* * * * *